United States Patent
Lippert et al.

(10) Patent No.: US 12,007,412 B2
(45) Date of Patent: Jun. 11, 2024

(54) DIFFERENTIAL MEASUREMENT PROBE

(71) Applicant: ROHDE & SCHWARZ GMBH & CO. KG, Munich (DE)

(72) Inventors: Benedikt Lippert, Munich (DE); Alexander Kunze, Munich (DE); Alexander Stuka, Hengersberg (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 0 days.

(21) Appl. No.: 17/729,378

(22) Filed: Apr. 26, 2022

(65) Prior Publication Data
US 2023/0341437 A1    Oct. 26, 2023

(51) Int. Cl.
*G01R 1/073* (2006.01)
*G01R 1/067* (2006.01)

(52) U.S. Cl.
CPC ..... *G01R 1/07307* (2013.01); *G01R 1/06788* (2013.01)

(58) Field of Classification Search
CPC .......... G01R 1/07307; G01R 1/06788
See application file for complete search history.

(56) References Cited

U.S. PATENT DOCUMENTS

| | | | |
|---|---|---|---|
| 2005/0079771 A1* | 4/2005 | DeLessert | H01R 13/66 439/700 |
| 2005/0264276 A1 | 12/2005 | Reed et al. | |
| 2006/0061348 A1* | 3/2006 | Cannon | G01R 1/06788 324/72.5 |
| 2007/0222468 A1* | 9/2007 | McTigue | G01R 1/06772 324/755.07 |
| 2007/0229099 A1 | 10/2007 | Campbell et al. | |
| 2009/0153159 A1* | 6/2009 | Reed | G01R 1/06788 324/754.03 |
| 2012/0313658 A1* | 12/2012 | Spinar | G01R 1/06788 324/755.01 |
| 2016/0216320 A1 | 7/2016 | McTique | |
| 2016/0223587 A1* | 8/2016 | Swaim | G01R 3/00 |
| 2018/0120350 A1 | 5/2018 | Kunze et al. | |
| 2022/0299545 A1 | 9/2022 | Kunze et al. | |
| 2023/0076176 A1* | 3/2023 | Ziegler | H05K 1/0271 |

* cited by examiner

*Primary Examiner* — Paresh Patel
(74) *Attorney, Agent, or Firm* — Brooks Kushman P.C.

(57) ABSTRACT

The present disclosure provides a differential measurement probe comprising a first support plate, a second support plate arranged in parallel to the first support plate, a first printed circuit probe tip that comprises a first contact section for contacting a device under test, and a second printed circuit probe tip that comprises a second contact section for contacting a device under test, wherein the first printed circuit probe tip and the second printed circuit probe tip are arranged between the first support plate and the second support plate and are mechanically supported by the first support plate and the second support plate.

16 Claims, 8 Drawing Sheets

DIFFERENTIAL MEASUREMENT PROBE

TECHNICAL FIELD

The disclosure relates to a differential measurement probe.

BACKGROUND

Although applicable to any signal measurement application, the present disclosure will mainly be described in conjunction with measuring high frequency signals with an oscilloscope.

When measuring high frequency signals of up to multiple 10s of GHz, measurement probes with adequate electrical properties are required that influence the measured signals as little as possible.

Accordingly, there is a need for providing improved measurement probes.

SUMMARY

The above stated problem is solved by the features of the independent claims. It is understood, that independent claims of a claim category may be formed in analogy to the dependent claims of another claim category.

Accordingly, it is provided:

A differential measurement probe comprising a first support plate, a second support plate arranged in parallel to the first support plate, a first printed circuit probe tip that comprises a first contact section for contacting a device under test, and a second printed circuit probe tip that comprises a second contact section for contacting a device under test, wherein the first printed circuit probe tip and the second printed circuit probe tip are arranged between the first support plate and the second support plate and are mechanically supported by the first support plate and the second support plate.

The present disclosure acknowledges that differential measurement probes, especially for high-speed measurements of up to multiple 10s of GHz, are usually very delicate devices that comprise a large number of components and are difficult to assemble and handle.

The present disclosure, therefore, provides a robust differential measurement probe, especially for high-speed measurements of up to multiple 10s of GHz, that may easily be manufactured, assembled and handled.

To this end, the differential measurement probe comprises a first support plate and a second support plate that are positioned overlapping each other. Between the first support plate and the second support plate two printed circuit probe tips are arranged. The first support plate and a second support plate may for example comprise the same shape and may be congruently aligned. Of course, in embodiments the first support plate and a second support plate may also comprise different shapes.

The first printed circuit probe tip and the second printed circuit probe tip are arranged in a sandwich-like arrangement between the first support plate and the second support plate. In this arrangement, the first printed circuit probe tip and the second printed circuit probe tip are mechanically supported by the first support plate and the second support plate in at least one dimension e.g., the vertical axis of the differential measurement probe.

The first printed circuit probe tip and the second printed circuit probe tip may be arranged in the space between the first support plate and the second support plate generally in parallel, and especially such that the contact sections of the first printed circuit probe tip and the second printed circuit probe tip lay next to each other for contacting two different measurement points, traces or conductors in a device under test, DUT. The term "contact section" in this context refers to a section of the probe tip that serves to directly contact the DUT.

The first printed circuit probe tip and the second printed circuit probe tip may both be provided from a PCB material and may both be manufactured with standard PCB-manufacturing processes. The first printed circuit probe tip and the second printed circuit probe tip may for example each be manufactured from FR4 material or a similar PCB material as a double sided or multi-layer PCB.

The first support plate and the second support plate may in embodiments also be manufactured from standard PCB material with standard PCB-manufacturing processes. In other embodiments, the first support plate and the second support plate may be manufactured from other materials and via other processes. The first support plate and the second support plate may for example be manufactured from an adequate kind of plastic material e.g., by injection molding, 3D-printing or cutting from sheets or plates of plastic material.

By providing the differential measurement probe with the two support plates and the first printed circuit probe tip and the second printed circuit probe tip between the support plates, a differential measurement probe with a very simple construction is provided that may easily be manufactured and handled.

Further embodiments of the present disclosure are subject of the further dependent claims and of the following description, referring to the drawings.

In an embodiment, the first printed circuit probe tip and the second printed circuit probe tip may each comprise a multi-layer printed circuit board with an inner conductor layer and at least one outer conductor layer.

By using a multi-layer printed circuit board for the first printed circuit probe tip and the second printed circuit probe tip the printed circuit probe tips may easily be manufactured with different layers that comprise different functions. While the inner conductor layer may be used to transport the signals to be measured, the outer conductor layer may for example be used for other tasks, like shielding.

The outer conductor layers may for example be electrically coupled to a ground potential e.g., via the cables that couple the differential measurement probe to the respective measurement device.

The influence of external interference signals may, therefore, be reduced and the signal quality of the signal to be measured may be improved.

In a further embodiment, the inner conductor layer may comprise a conductor trace for conducting a signal to be measured from the contact section of the respective printed circuit probe tip to a connection section of the respective printed circuit probe tip. The at least one outer conductor layer may comprise a conductive shielding layer.

In this arrangement, the at least one outer conductor layer with the conductive shielding layer provides a shielding for the inner conductor layer, that transports or conducts the signals to be measured. In an embodiment, the first printed circuit probe tip and the second printed circuit probe tip comprise two outer conductor layers, on the upside and the downside, each with a respective conductive shielding layer.

The shielding layer may for example cover the respective surface of the first support plate or the second support plate substantially completely.

Further, in embodiments, the edges of the first printed circuit probe tip and the second printed circuit probe tip may be covered with a conductive material to electrically couple the two conductive shielding layers on the upside and the downside of the first printed circuit probe tip or the second printed circuit probe tip, respectively.

The conductor trace in the inner conductor layer, as explained above, serves for conducting a signal to be measured form the contact section of the respective printed circuit probe tip to a connection section of the respective printed circuit probe tip.

The contact section may have any adequate form that serves for contacting respective measurement points or traces on a DUT.

The connection section may for example comprise any type of connector that may be used for coupling the respective printed circuit probe tip to a measurement device e.g., an Oscilloscope. Such a connection section may for example comprise a connector e.g., a Mini-SMP connector, for coupling the printed circuit probe tip to the measurement device. The conductor trace may provide an electric signal path from the contact section to the connector in the connection section. Of course, vias and other elements may be provided in the printed circuit probe tips to couple the conductor trace top such a connector.

The arrangement of an inner conductor layer with a conductor trace and one or two outer conductor layers with a shielding function may be seen as a kind of coaxial conductor arrangement, that provides an improved shielding for the signals that travel on the conductor trace.

The differential measurement probe of the present disclosure may therefore easily be used in measurement applications with signals of frequencies of up to 30 GHz and more.

In another embodiment, at least one of the first support plate and the second support plate may comprise at least one conductive surface that faces the first printed circuit probe tip and the second printed circuit probe tip.

In such an embodiment, the conductive shielding layers of the first printed circuit probe tip and the second printed circuit probe tip are electrically coupled to each other via the conductive surface of the at least one of the first support plate and the second support plate.

If at least one of the support plates is provided with a conductive surface facing the first printed circuit probe tip and the second printed circuit probe tip, the overall shielding of the signals in the first printed circuit probe tip and the second printed circuit probe tip is improved.

It is understood, that the conductive surface not necessarily needs to cover the whole surface of the first support plate or the second support plate, as long as an electrical contact between the first printed circuit probe tip and the second printed circuit probe tip is provided.

In yet another embodiment, the at least one conductive surface may extend from the edge of the first support plate and the second support plate, respectively, that faces the ends of the first printed circuit probe tip and the second printed circuit probe tip that contact the device under test.

If any interference signal is present, while preforming a measurement, it is important, to provide a shielding as early and complete as possible in the signal chain. Providing the conductive surface of at least one of the support plates starting at the edge of the respective support plate that faces the contact section of the first printed circuit probe tip and the second printed circuit probe tip ensures that the unshielded section of the first printed circuit probe tip and the second printed circuit probe tip is as small as possible.

With such an arrangement, a capacitive coupling is provided that closes a signal path between the first printed circuit probe tip and the second printed circuit probe tip for high frequency interference signals as near as possible to the contact sections.

In an embodiment, at least one of the first support plate and the second support plate may comprise at least one of a metallic conductive material and Teflon.

A mix of metallic conductive materials and Teflon provides the conductive property for the support plates and at the same time reduces friction between the support plates and the printed circuit probe tips.

This is especially beneficial in embodiments that allow positioning the first printed circuit probe tip and the second printed circuit probe tip at a desired distance to each other.

In a further embodiment, the first support plate and the second support plate may maximally extend to the contact sections of the first printed circuit probe tip and the second printed circuit probe tip without electrically contacting the signal path for a signal to be measured.

With such an arrangement, the mechanical support of the first printed circuit probe tip and the second printed circuit probe tip by the support plates is maximized.

In another embodiment, a capacitive coupling may be provided between at least one of the first support plate and the second support plate, and at least one outer conductor layer of the first printed circuit probe tip and the second printed circuit probe tip, respectively.

As explained above, the first support plate and the second support plate may comprise a conductive surface. If the first support plate and the second support plate are provided as a mix of a metallic conductive material and Teflon, at least a capacitive coupling is provided between the outer conductor layers of the first printed circuit probe tip and the second printed circuit probe tip.

In order to reduce the inductivity in the measurement setup, it is important to provide the capacitive coupling as near as possible to the measurement point in the device under test.

To this end, the first support plate and the second support plate may extend to the contact sections of the first printed circuit probe tip and the second printed circuit probe tip as much as possible, without touching or connection to any of the signal conducting elements of the first printed circuit probe tip and the second printed circuit probe tip.

In yet another embodiment, the distance between the first support plate and the second support plate may be fixed.

To set the distance between the two support plates respective spacers may be provided that may be arranged between the two support plates. The two support plates may then for example be screwed together or may be held together by a respective housing.

Fixing the distance between the two support plates allows providing a defined force on the first printed circuit probe tip and the second printed circuit probe tip and, therefore, a well-defined friction when moving the first printed circuit probe tip and the second printed circuit probe tip.

In an embodiment, the differential measurement probe may further comprise a spring arrangement that presses at least one of the first support plate and the second support plate onto the first printed circuit probe tip and the second printed circuit probe tip.

By pressing at least one of the support plates onto the first printed circuit probe tip and the second printed circuit probe tip the electrical coupling between the support plates and the first printed circuit probe tip and the second printed circuit probe tip may be ensured.

In a further embodiment, the distance between the first printed circuit probe tip and the second printed circuit probe tip may be variable.

In the differential measurement probe a respective mechanical arrangement may be provided that allows adapting the distance between the two printed circuit probe tips, especially between the contact sections of the first printed circuit probe tip and the second printed circuit probe tip. Such an arrangement may for example comprise a threaded rod or bar that may be turned via a respective handle or wheel and that mechanically couples to the two printed circuit probe tips, such that the two printed circuit probe tips move to each other or away from each other, when the threaded rod or bar turns.

Providing the ability to adapt the distance between the two printed circuit probe tips allows adapting the two printed circuit probe tips to measurement points in the device under test.

Of course, the maximum distance may be limited by the size of the support plates that in any case still cover the two printed circuit probe tips at least partially.

In another embodiment, at least one of the first printed circuit probe tip and the second printed circuit probe tip may be flexibly supported at least in a longitudinal direction of the differential measurement probe.

Usually, a user will push the differential measurement probe onto a device under test in the direction of the longitudinal direction of the differential measurement probe.

Flexibly supporting the two printed circuit probe tips in this direction makes sure that electrical contact is established evenly between the two printed circuit probe tips and the device under test.

In yet another embodiment, at least one of the first printed circuit probe tip and the second printed circuit probe tip may comprise a meandering section for providing the flexible support.

By shaping a meandering section in at least one of the two printed circuit probe tips, the flexible support may be provided without additional mechanical elements.

It is understood, that the meandering section may comprise a least one recess that forms a kind of bend with the material of the respective printed circuit probe tip.

In a further embodiment, the differential measurement probe may further comprise a grip for manually holding the differential measurement probe.

The elements of the differential measurement probe may be covered by a housing. Such a housing may form a grip for manually holding the differential measurement probe.

A user may therefore contact a device under test manually and perform tests at different positions of the device under test easily.

In another embodiment, at least one of the first contact section and the second contact section may comprise a metallized section of material of the respective printed circuit probe tip that is coupled to a signal conductor, for example the signal conductor trace in the inner conductor layer if present in the respective embodiment, or a metallized section of material of the respective printed circuit probe tip and a resistor that couples the metalized section to a signal conductor, for example the signal conductor trace in the inner conductor layer if present in the respective embodiment, or a metallic tip that is soldered to the material of the respective printed circuit probe tip that is coupled to a signal conductor, for example the signal conductor trace in the inner conductor layer if present in the respective embodiment.

The first printed circuit probe tip and the second printed circuit probe tip may be provided with different types of contact sections.

The contact sections may for example be provided as a metalized section of the carrier material of which the respective printed circuit probe tip is made.

Such a metalized section may directly be coupled to a respective signal conductor. This arrangement also allows inject signals into the device under test, for example for performing a TDR, time domain reflectometry measurements.

For measuring signals, a resistor may be provided in the contact section for coupling the metalized section via the resistor with a respective signal conductor. This reduces the influence of the differential measurement probe onto the device under test. Of course, the embodiment with the metallic tip may also comprise a resistor.

BRIEF DESCRIPTION OF THE DRAWINGS

For a more complete understanding of the present disclosure and advantages thereof, reference is now made to the following description taken in conjunction with the accompanying drawings. The disclosure is explained in more detail below using exemplary embodiments which are specified in the schematic figures of the drawings, in which.

In the figures like reference signs denote like elements unless stated otherwise.

DETAILED DESCRIPTION OF THE DRAWINGS

Figure 1:
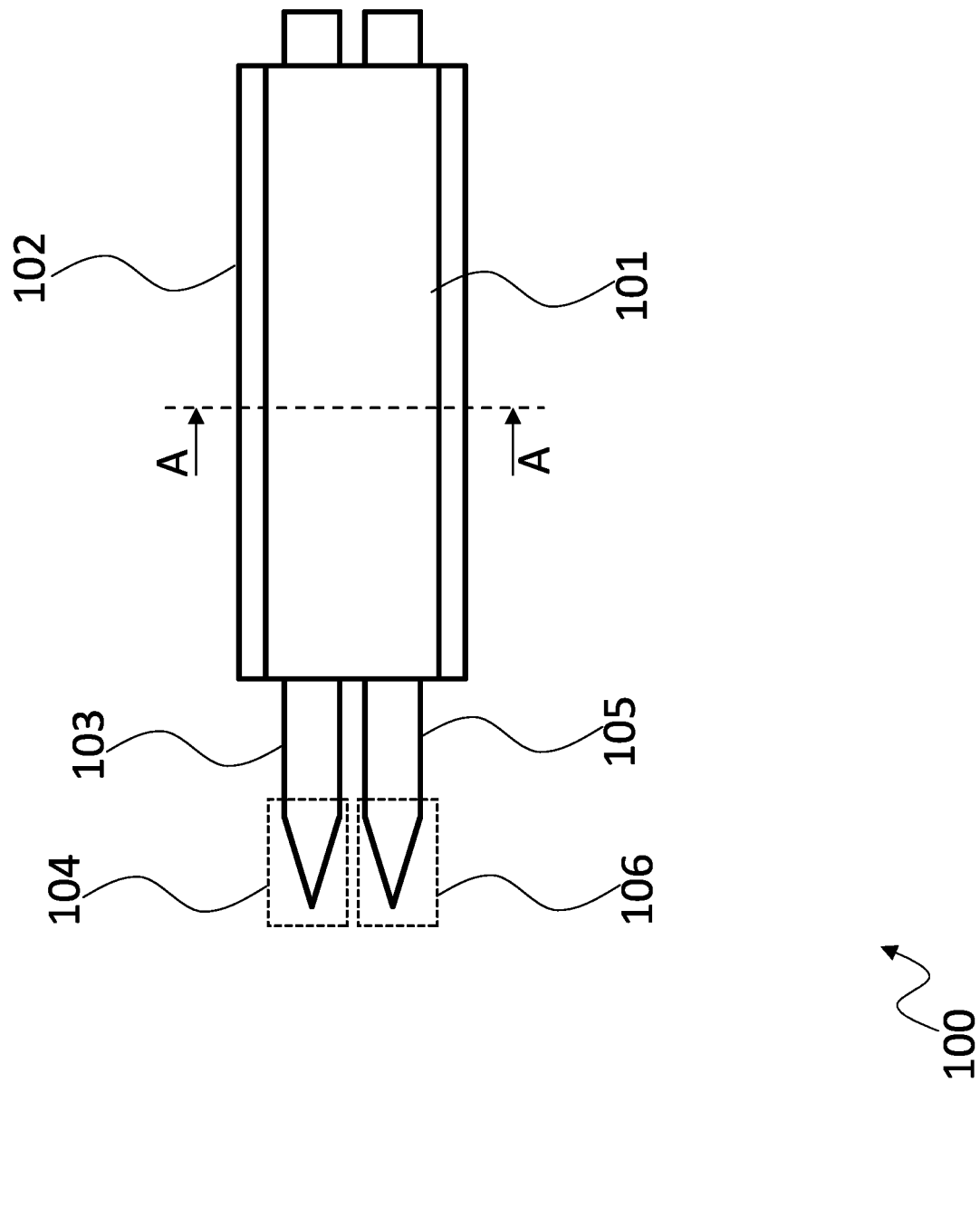
FIG. 1 shows a schematic view of an embodiment of a differential measurement probe according to the present disclosure.

FIG. 1 shows a block diagram of a differential measurement probe 100. The differential measurement probe 100 comprises a first support plate 101 and a second support plate 102. The first support plate 101 and the second support plate 102 are arranged on top of each other or overlapping each other. The first support plate 101 and the second support plate 102 of the differential measurement probe 100 do not comprise the same shape. In the differential measurement probe 100 the second support plate 102 is wider than the first support plate 101. The protruding sections of the second support plate 102 may for example be used to hold a cover (not shown).

The differential measurement probe 100 further comprises first printed circuit probe tip 103 with a first contact section 104, and a second printed circuit probe tip 105 with a second contact section 106. The first printed circuit probe tip 103 and the second printed circuit probe tip 105 are provided between the first support plate 101 and the second support plate 102. This arrangement may for example be called a sandwich-arrangement or sandwich-like arrangement.

The first contact section 104 and the second contact section 106 are exemplarily formed as pointed tips. It is understood, that the first contact section 104 and the second contact section 106 in other embodiments may be formed in any adequate shape.

The first contact section 104 and the second contact section 106 serve for contacting measurement points or test points in a device under test. Although not explicitly shown, it is understood, that the first printed circuit probe tip 103 and the second printed circuit probe tip 105 may comprise respective connection means on the end opposing the first contact section 104 and the second contact section 106, respectively. Such connection means may for example comprise connectors like Mini-SMP connectors.

In the sandwich-like arrangement the distance between the first printed circuit probe tip 103 and the second printed circuit probe tip 105 may be adapted for example, by simply sliding the first printed circuit probe tip 103 and the second printed circuit probe tip 105 into position.

Of course, other mechanical moving means my also be provided. Such mechanical moving means may comprise threaded rods or bars as explained above. Such an arrangement may be similar to analog arrangements known from drawing compasses.

Figure 2:
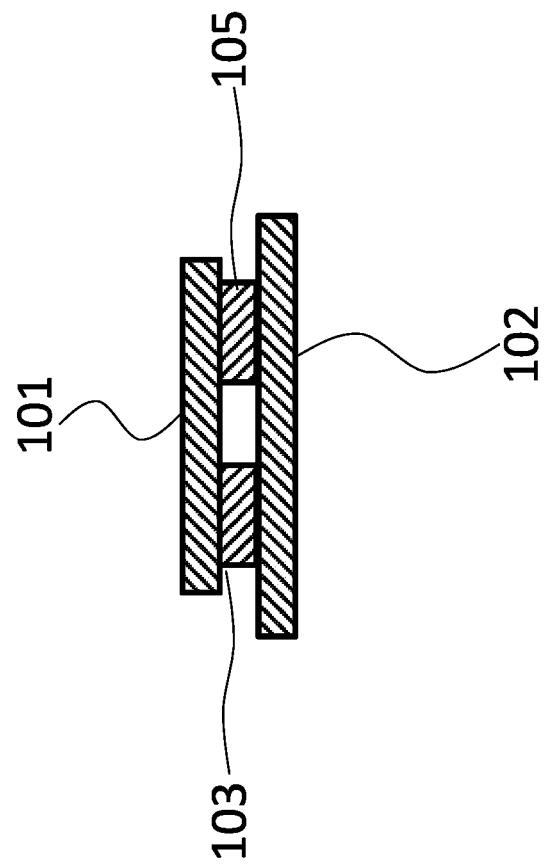
FIG. 2 shows a cross-sectional view of the embodiment of a differential measurement probe of FIG. 1.

FIG. 2 shows a cross-sectional view of the differential measurement probe 100 along the line A-A as shown in FIG. 1.

It can be seen that the first printed circuit probe tip 103 and the second printed circuit probe tip 105 are both provided between the first support plate 101 and the second support plate 102, and how the distance between the first printed circuit probe tip 103 and the second printed circuit probe tip 105 may be adapted by sliding or moving the at least one of the first printed circuit probe tip 103 and the second printed circuit probe tip 105 between the first support plate 101 and the second support plate 102.

Although not shown, it is understood, that at least one of the first support plate 101, the second support plate 102, the first printed circuit probe tip 103 and the second printed circuit probe tip 105 may comprise at least one of guiding elements, fixing elements, alignment elements, and restriction or limitation elements, for guiding, fixing, aligning and restricting or limiting the movement of the first printed circuit probe tip 103 and the second printed circuit probe tip 105.

Figure 3:
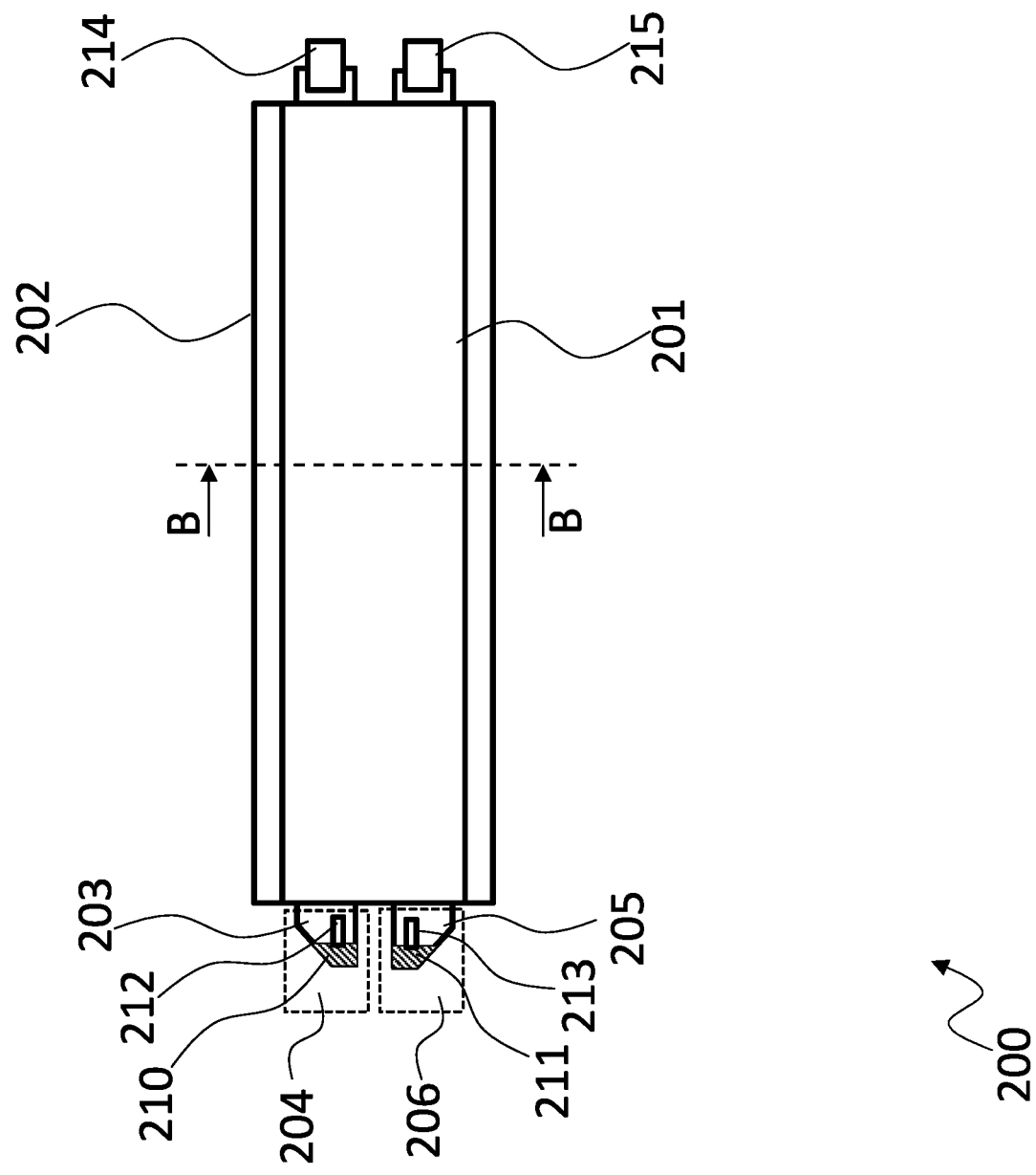
FIG. 3 shows a schematic view of another embodiment of a differential measurement probe according to the present disclosure.

FIG. 3 shows a block diagram of a differential measurement probe 200. The differential measurement probe 200 is based on the differential measurement probe 100 and comprises a first support plate 201 and a second support plate 202 with a first printed circuit probe tip 203 and a second printed circuit probe tip 205 arranged between the first support plate 201 and the second support plate 202.

The first printed circuit probe tip 203 comprises a first contact section 204 and the second printed circuit probe tip 205 comprises a second contact section 206.

The first contact section 204 and the second contact section 206 each comprise a metallized section 210, 211 at the front end that serves for contacting a device under test. Such metallized sections 210, 211 may directly be coupled to a signal conductor trace to transport the signals. However, the first contact section 204 and the second contact section 206 each comprise a resistor 212, 213, especially a SMD resistor, that couple the first contact section 204 and the second contact section 206 to such a trace, respectively.

At the ends opposing the first contact section 204 and the second contact section 206, respectively, the first printed circuit probe tip 203 and the second printed circuit probe tip 205 each comprise a connector 214, 215 to couple the first printed circuit probe tip 203 and the second printed circuit probe tip 205 to a respective measurement device. Although, the connectors 214, 215 are described herein as Mini-SMP connectors in some embodiments, it is understood, that any other adequate type of connector may also be used.

In embodiments, instead of metallized sections 210, 211, metallic tips may be soldered to the first printed circuit probe tip 203 and the second printed circuit probe tip 205. Such metallic tips may be used with or without the resistors 212, 213.

Figure 4:
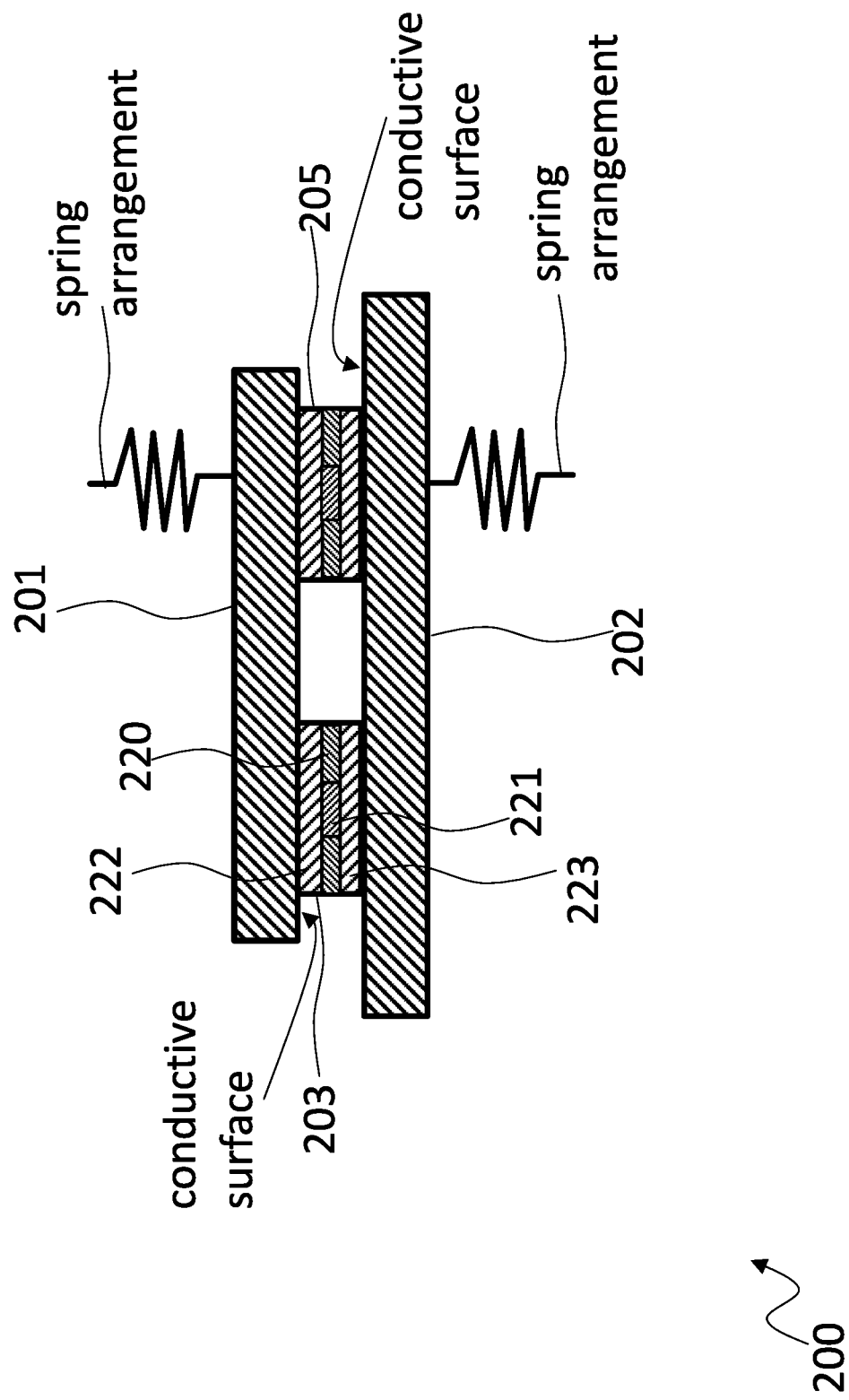
FIG. 4 shows a cross-sectional view of the embodiment of a differential measurement probe of FIG. 3.

FIG. 4 shows a cross-sectional view of the differential measurement probe 200 along the line B-B as shown in FIG. 3. The above explanations of FIG. 2 apply mutatis mutandis.

The first printed circuit probe tip 203 and the second printed circuit probe tip 205 each comprise a multi-layer printed circuit board with an inner conductor layer 220 and two outer conductor layers 222, 223, wherein the inner conductor layer 220 comprises a conductor trace 221 for transmitting the signal to be measured from the metallized sections 210, 211 to the connectors 214, 215. For sake of clarity, only the first printed circuit probe tip 203 is provided with dedicated reference signs.

Although not explicitly show, it is understood, that any type of vias or other elements may be provided in the first printed circuit probe tip 203 and the second printed circuit probe tip 205 to couple the metallized sections 210, 211 and the connectors 214, 215 with the respective conductor traces 221.

It is understood, that in all of the embodiments described herein, the first printed circuit probe tip 103, 203 and the second printed circuit probe tip 105, 205 each may comprise the multi-layer printed circuit board with the inner conductor layer 220 and at least one outer conductor layer 222, 223.

The inner conductor layer 220 may comprise the conductor trace 221, and the at least one outer conductor layer 222, 223 may comprises a conductive shielding layer. Such a conductive shielding layer may e.g., be provided as a dedicated layer that may be manufactured on the outer surface(s) of the first printed circuit probe tip 103, 203 and the second printed circuit probe tip 105, 205.

Further, in any of the embodiments of the differential measurement probe 100, 200 at least one of the first support plate 101, 201 and the second support plate 102, 202 may comprise at least one conductive surface that faces the first printed circuit probe tip 103, 203 and the second printed circuit probe tip 105, 205.

Figure 5:
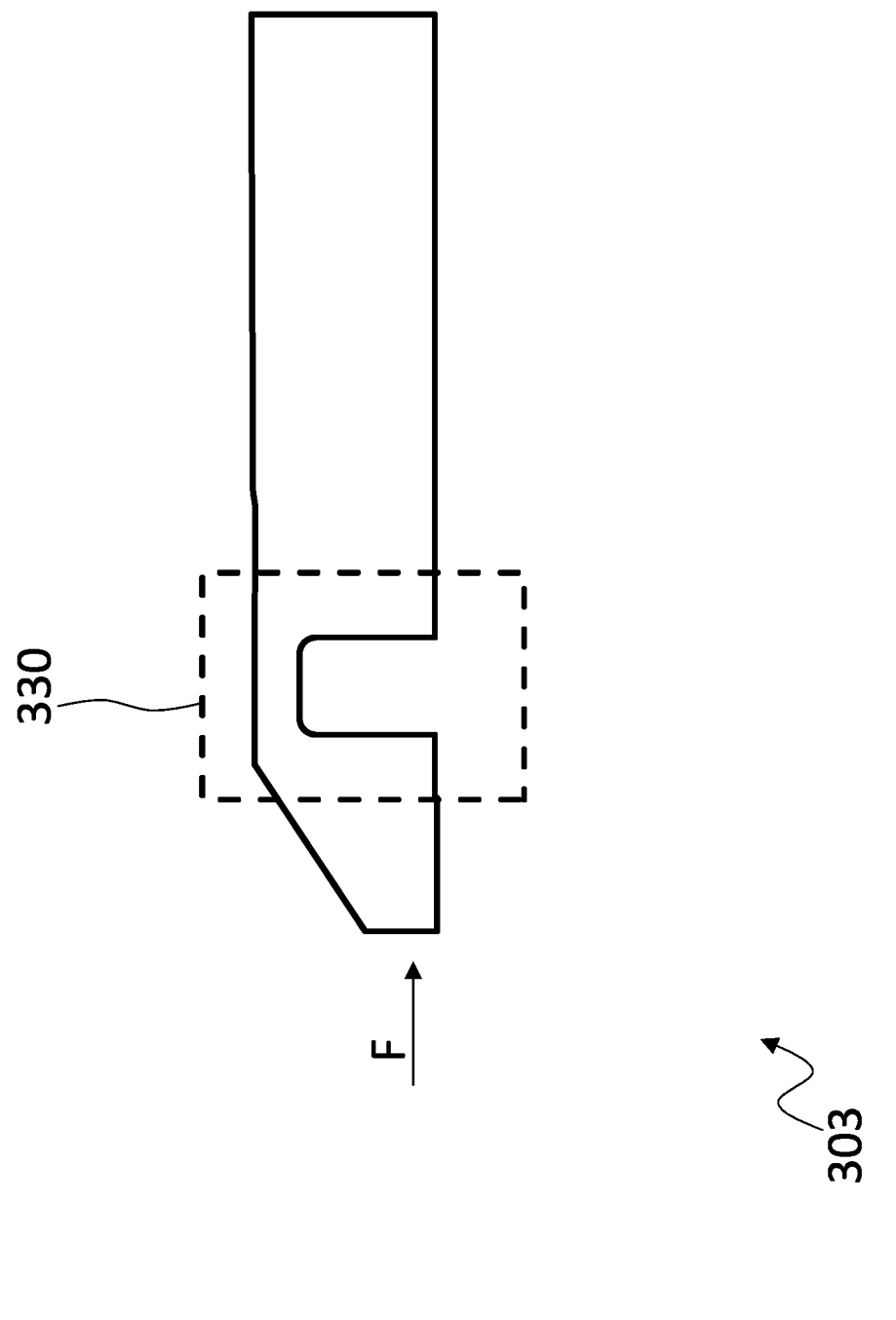
FIG. 5 shows a schematic view of another embodiment of a printed circuit probe tip according to the present disclosure.

FIG. 5 shows a schematic view of a printed circuit probe tip 303. In a cross-sectional view, the printed circuit probe tip 303 may comprise an arrangement of any of the printed circuit probe tips of the present disclosure.

In addition, the printed circuit probe tip 303 comprises a meandering section 330. The meandering section 330 serves as a flexible or spring-like arrangement that allows the printed circuit probe tip 303 to flexibly accommodate forces in the direction F.

Of course, in other embodiments, other types of mechanical arrangements, like for example springs may be provided in the differential measurement probes to flexibly accommodate the printed circuit probe tips.

Figure 6:
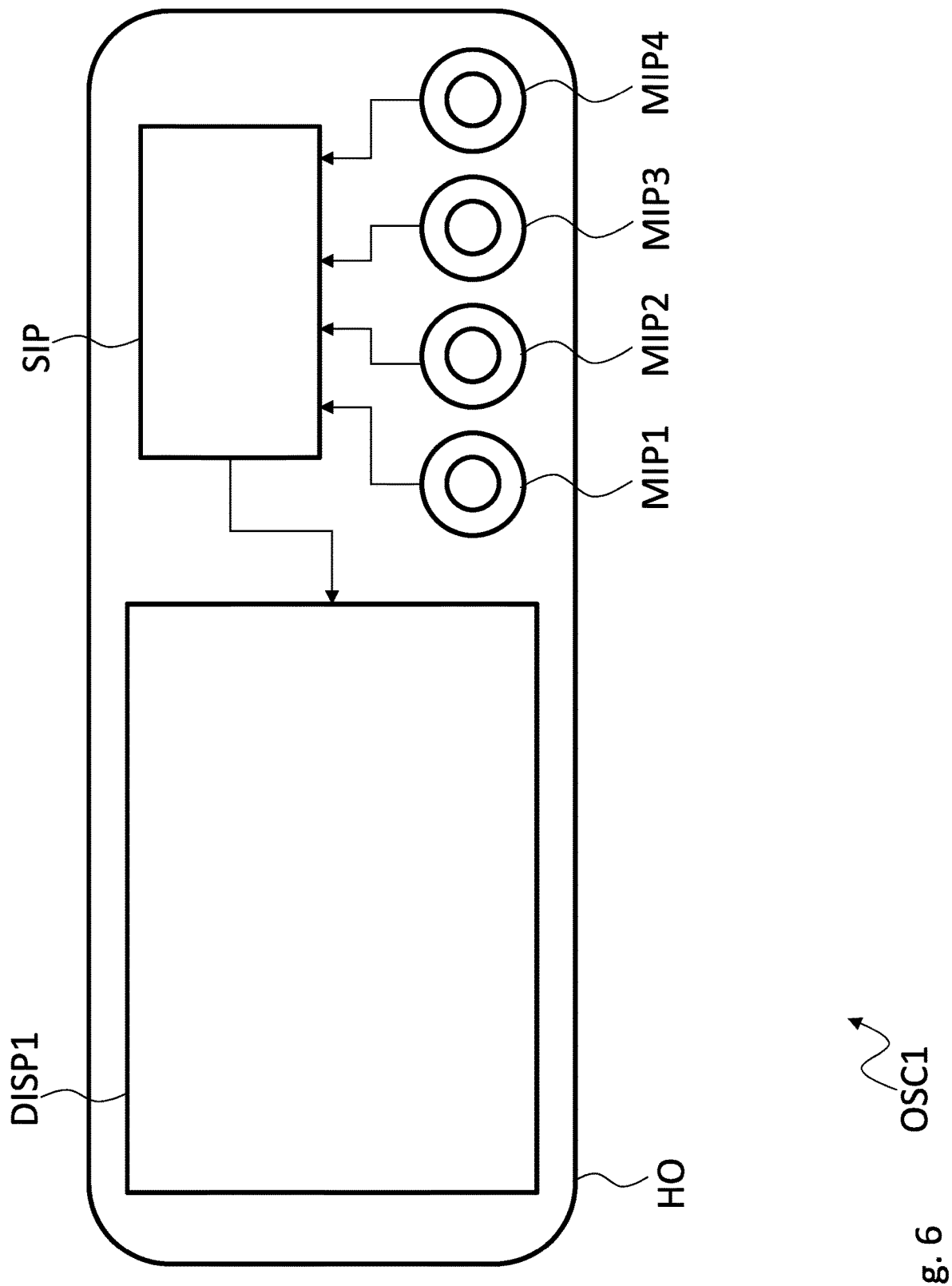
FIG. 6 shows a block diagram of an embodiment of an oscilloscope that may be used with an embodiment of a differential measurement probe according to the present disclosure.

FIG. 6 shows a block diagram of an oscilloscope OSC1 that may be used with an embodiment of a differential measurement probe according to the present disclosure.

The oscilloscope OSC1 comprises a housing HO that accommodates four measurement inputs MIP1, MIP2, MIP3, MIP4 that are coupled to a signal processor SIP for processing any measured signals. The signal processor SIP is coupled to a display DISP1 for displaying the measured signals to a user.

Although not explicitly shown, it is understood, that the oscilloscope OSC1 may also comprise signal outputs that may also be coupled to the differential measurement probe. Such signal outputs may for example serve to output calibration signals. Such calibration signals allow calibrating the measurement setup prior to performing any measurement. The process of calibrating and correcting any measurement signals based on the calibration may also be called de-embedding and may comprise applying respective algorithms on the measured signals.

Figure 7:
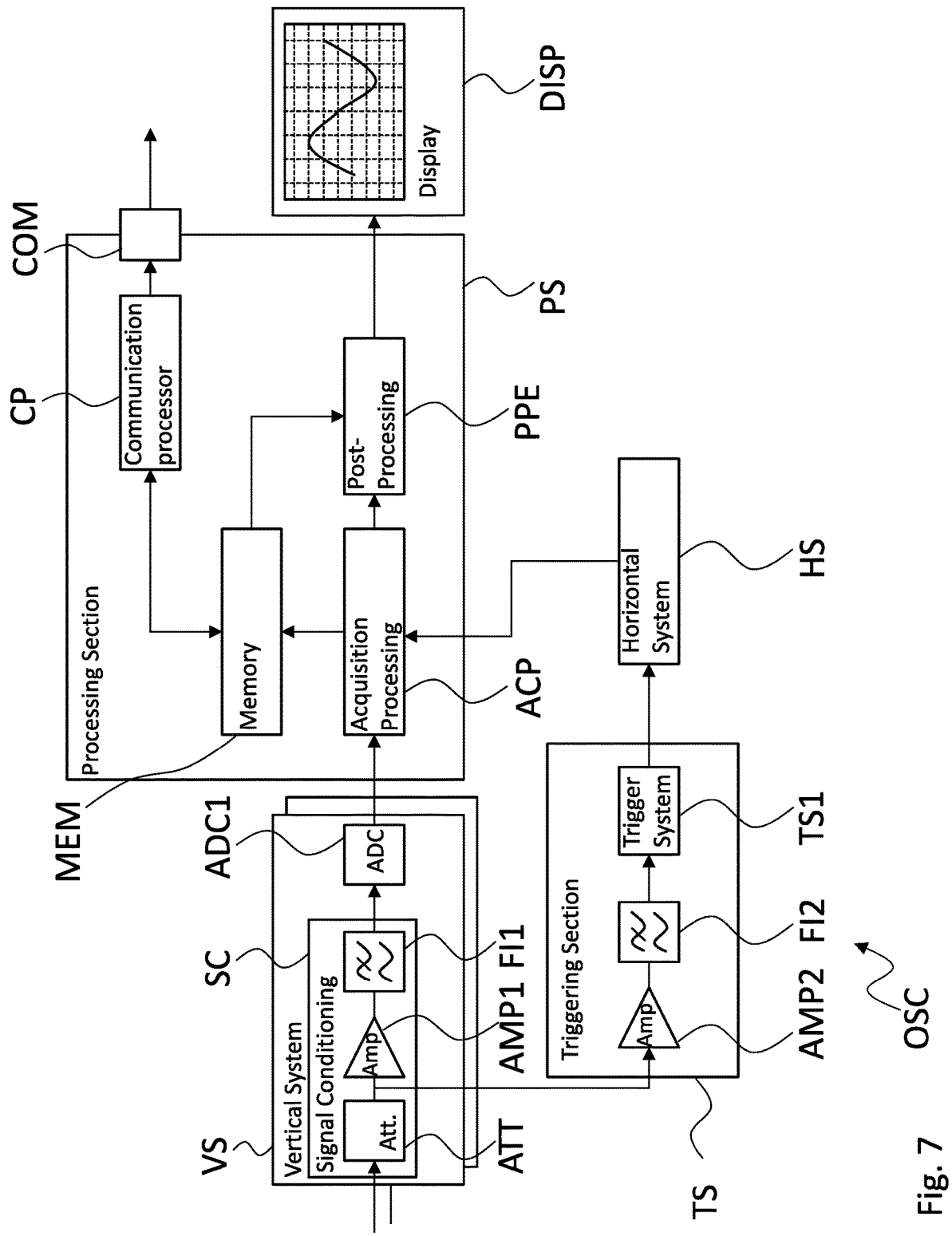
FIG. 7 shows a block diagram of another embodiment of an oscilloscope that may be used with an embodiment of a differential measurement probe according to the present disclosure.
Figure 8:
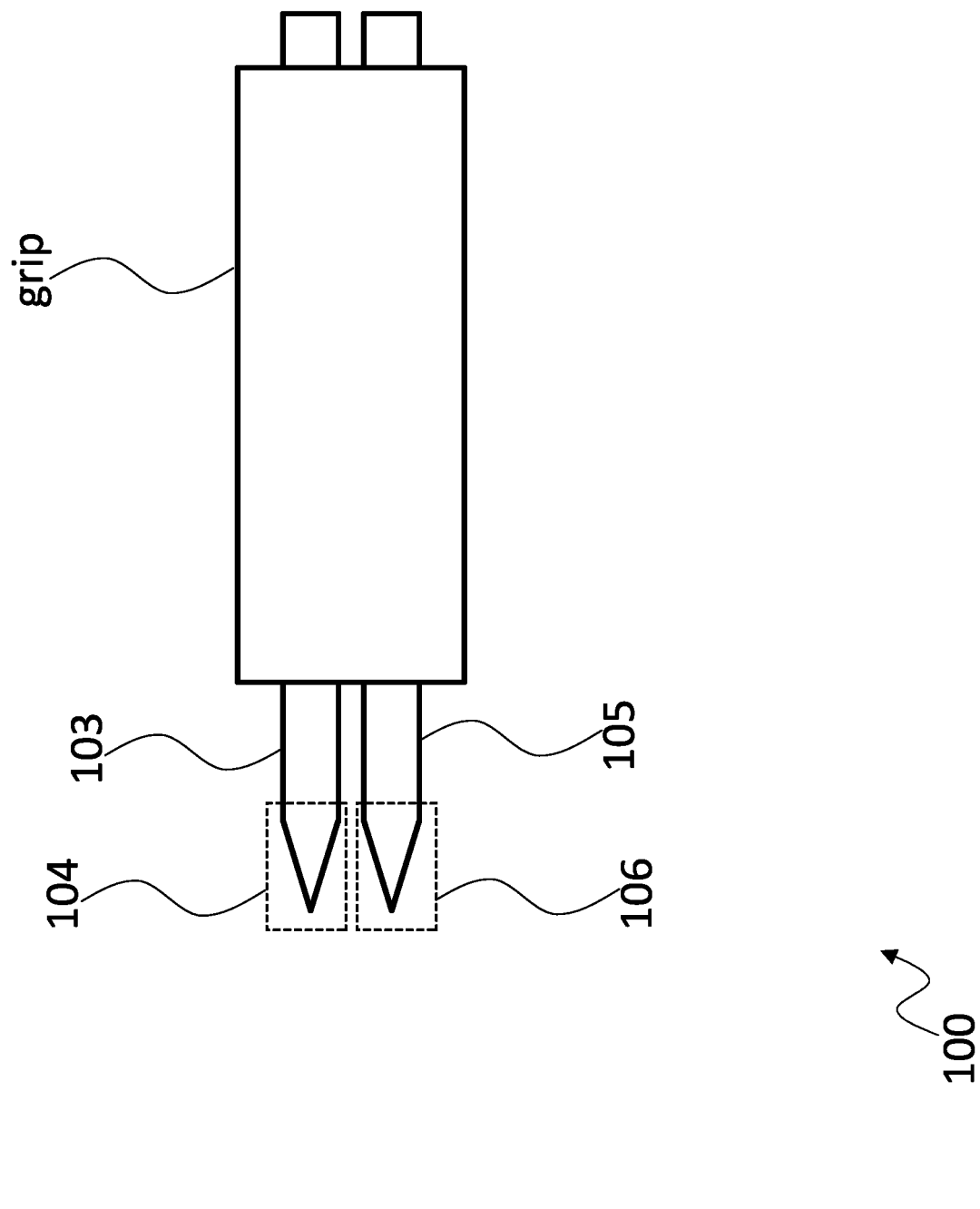
FIG. 8 shows a block diagram of a grip of the differential measurement probe according to the present disclosure.

FIG. 7 shows a block diagram of another oscilloscope OSC that may be an implementation of a measurement device for use with any of the embodiments of a differential measurement probe of the present disclosure. The oscilloscope OSC is implemented as a digital oscilloscope. However, the present disclosure may also be implemented with any other type of oscilloscope.

The oscilloscope OSC exemplarily comprises five general sections, the vertical system VS, the triggering section TS, the horizontal system HS, the processing section PS and the display DISP. It is understood, that the partitioning into five general sections is a logical partitioning and does not limit the placement and implementation of any of the elements of the oscilloscope OSC in any way.

The vertical system VS mainly serves for attenuating or amplifying a signal to be acquired. The signal may for example be modified to fit the signal in the available space on the display DISP or to comprise a vertical size as configured by a user.

To this end, the vertical system VS comprises a signal conditioning section SC with an attenuator ATT that is coupled to an amplifier AMP1. The amplifier AMP1 is coupled to a filter FI1, which in the shown example is provided as a low pass filter. The vertical system VS also comprises an analog-to-digital converter ADC1 that receives the output from the filter FI1 and converts the received analog signal into a digital signal.

The attenuator ATT and the amplifier AMP1 serve to scale the waveform of the signal and to condition the amplitude of the signal to be acquired to match the operation range of the analog-to-digital converter ADC1. The filter FI1 serves to filter out unwanted high frequency components of the signal to be acquired.

The triggering section TS comprises an amplifier AMP2 that is coupled to a filter FI2, which in this embodiment is implemented as a low pass filter. The filter FI2 is coupled to a trigger system TS1.

The triggering section TS serves to capture predefined signal events and allows the horizontal system HS to e.g., display a stable view of a repeating waveform, or to simply display waveform sections that comprise the respective signal event. It is understood, that the predefined signal event may be configured by a user via a user input of the oscilloscope OSC.

Possible predefined signal events may for example include, but are not limited to, when the signal crosses a predefined trigger threshold in a predefined direction i.e., with a rising or falling slope. Such a trigger condition is also called an edge trigger. Another trigger condition is called "glitch triggering" and triggers, when a pulse occurs in the signal to be acquired that has a width that is greater than or less than a predefined amount of time.

The triggering section TS operates on the signal as provided by the attenuator ATT, which is fed into the amplifier AMP2. The amplifier AMP2 serves to condition the input signal to the operating range of the trigger system TS1. It is understood, that a common amplifier may also be used instead of the dedicated amplifiers AMP1 and AMP2.

In order to allow an exact matching of the trigger event and the waveform that is shown on the display DISP, a common time base may be provided for the analog-to-digital converter ADC1 and the trigger system TS1.

It is understood, that although not explicitly shown, the trigger system TS1 may comprise at least one of configurable voltage comparators for setting the trigger threshold voltage, fixed voltage sources for setting the required slope, respective logic gates like e.g., a XOR gate, and FlipFlops to generate the triggering signal.

The triggering section TS is exemplarily provided as an analog trigger section. It is understood, that the oscilloscope OSC may also be provided with a digital triggering section. Such a digital triggering section will not operate on the analog signal as provided by the attenuator ATT but will operate on the digital signal as provided by the analog-to-digital converter ADC1.

A digital triggering section may comprise a processing element, like a processor, a DSP, a CPLD or an FPGA to implement digital algorithms that detect a valid trigger event.

The horizontal system HS is coupled to the output of the trigger system TS1 and mainly serves to position and scale the signal to be acquired horizontally on the display DISP.

The oscilloscope OSC further comprises a processing section PS that implements digital signal processing and data storage for the oscilloscope OSC. The processing section PS comprises an acquisition processing element ACP that is couple to the output of the analog-to-digital converter ADC1 and the output of the horizontal system HS as well as to a memory MEM and a post processing element PPE.

The acquisition processing element ACP manages the acquisition of digital data from the analog-to-digital converter ADC1 and the storage of the data in the memory MEM. The acquisition processing element ACP may for example comprise a processing element with a digital interface to the analog-to-digital converter ADC1 and a digital interface to the memory MEM. The processing element may for example comprise a microcontroller, a DSP, a CPLD or an FPGA with respective interfaces. In a microcontroller or DSP, the functionality of the acquisition processing element ACP may be implemented as computer readable instructions that are executed by a CPU. In a CPLD or FPGA the functionality of the acquisition processing element ACP may be configured in to the CPLD or FPGA.

The post processing element PPE may be controlled by the acquisition processing element ACP and may access the memory MEM to retrieve data that is to be displayed on the display DISP. The post processing element PPE may condition the data stored in the memory MEM such that the display DISP may show the data e.g., as waveform to a user.

The display DISP controls all aspects of signal representation to a user, although not explicitly shown, may comprise any component that is required to receive data to be displayed and control a display device to display the data as required.

It is understood, that even if it is not shown, the oscilloscope OSC may also comprise a user interface for a user to interact with the oscilloscope OSC. Such a user interface may comprise dedicated input elements like for example knobs and switches. At least in part the user interface may also be provided as a touch sensitive display device.

It is understood, that all elements of the oscilloscope OSC that perform digital data processing may be provided as dedicated elements. As alternative, at least some of the above-described functions may be implemented in a single hardware element, like for example a microcontroller, DSP, CPLD or FPGA. Generally, the above-describe logical functions may be implemented in any adequate hardware element of the oscilloscope OSC and not necessarily need to be partitioned into the different sections explained above.

Although specific embodiments have been illustrated and described herein, it will be appreciated by those of ordinary skill in the art that a variety of alternate and/or equivalent implementations exist. It should be appreciated that the exemplary embodiment or exemplary embodiments are only examples, and are not intended to limit the scope, applicability, or configuration in any way. Rather, the foregoing summary and detailed description will provide those skilled in the art with a convenient road map for implementing at least one exemplary embodiment, it being understood that various changes may be made in the function and arrangement of elements described in an exemplary embodiment without departing from the scope as set forth in the appended claims and their legal equivalents. Generally, this application is intended to cover any adaptations or variations of the specific embodiments discussed herein.

LIST OF REFERENCE SIGNS 100, 200 differential measurement probe
101, 201 first support plate
102, 202 second support plate
103, 203, 303 first printed circuit probe tip
104, 204 first contact section
105, 205 second printed circuit probe tip
106, 206 second contact section
210, 211 metalized section
212, 213 resistor
214, 215 connector
220 inner conductor layer
221 conductor trace
222, 223 outer conductor layer
330 meandering section
F force
OSC1 oscilloscope
HO housing
MIP1, MIP2, MIP3, MIP4 measurement input
SIP signal processor
DISP1 display
OSC oscilloscope
VS vertical system
SC signal conditioning
ATT attenuator
AMP1 amplifier
FI1 filter
ADC1 analog-to-digital converter
TS triggering section
AMP2 amplifier
FI2 filter
TS1 trigger system
HS horizontal system
PS processing section
ACP acquisition processing element
MEM memory
PPE post processing element
DISP display

What is claimed is:

1. A differential measurement probe comprising:
a first support plate;
a second support plate arranged in parallel to the first support plate;
a first printed circuit probe tip that comprises a first contact section for contacting a device under test; and
a second printed circuit probe tip that comprises a second contact section for contacting a device under test;
wherein the first printed circuit probe tip and the second printed circuit probe tip are arranged between the first support plate and the second support plate and are mechanically supported by the first support plate and the second support plate;
wherein the first printed circuit probe tip and the second printed circuit probe tip each comprise a multi-layer printed circuit board with an inner conductor layer, an outer conductor layer on one side of the inner conductor layer, and another outer conductor layer on the other side of the inner conductor layer.

2. The differential measurement probe according to claim 1, wherein the inner conductor layer comprises a conductor trace for conducting a signal to be measured from the contact section of the respective printed circuit probe tip to a connection section of the respective printed circuit probe tip; and
wherein the outer conductor layers comprise a conductive shielding layer.

3. The differential measurement probe according to claim 1, wherein at least one of the first support plate and the second support plate comprises at least one conductive surface that faces the first printed circuit probe tip and the second printed circuit probe tip.

4. The differential measurement probe according to claim 3, wherein the at least one conductive surface extends from the edge of the first support plate and the second support plate, respectively, that faces the ends of the first printed circuit probe tip and the second printed circuit probe tip that contact the device under test.

5. The differential measurement probe according to claim 3, wherein at least one of the first support plate and the second support plate comprises at least one of a metallic conductive material and Teflon.

6. The differential measurement probe according to claim 1, wherein the first support plate and the second support plate maximally extend to the contact sections of the first printed circuit probe tip and the second printed circuit probe tip without electrically contacting the signal path for a signal to be measured.

7. The differential measurement probe according to claim 6, wherein a capacitive coupling is provided between at least one of the first support plate and the second support plate, and at least one outer conductor layer of the first printed circuit probe tip and the second printed circuit probe tip, respectively.

8. The differential measurement probe according to claim 1, wherein the distance between the first support plate and the second support plate is fixed.

9. The differential measurement probe according to claim 1, further comprising a spring arrangement that presses at least one of the first support plate and the second support plate onto the first printed circuit probe tip and the second printed circuit probe tip.

10. The differential measurement probe according to claim 1, wherein the distance between the first printed circuit probe tip and the second printed circuit probe tip is variable.

11. The differential measurement probe according to claim 1, wherein at least one of the first printed circuit probe tip and the second printed circuit probe tip is flexibly supported at least in a longitudinal direction of the differential measurement probe.

12. The differential measurement probe according to claim 11, wherein at least one of the first printed circuit probe tip and the second printed circuit probe tip comprises a meandering section for providing the flexible support.

13. The differential measurement probe according to claim 1, further comprising a grip for manually holding the differential measurement probe.

14. The differential measurement probe according to claim 1, wherein at least one of the first contact section and the second contact section comprises:
   a metallized section of material of the respective printed circuit probe tip that is coupled to a signal conductor; or
   a metallized section of material of the respective printed circuit probe tip and a resistor that couples the metallized section to a signal conductor; or
   a metallic tip that is soldered to the material of the respective printed circuit probe tip.

15. A differential measurement probe comprising:
   a first support plate;
   a second support plate arranged in parallel to the first support plate;
   a first printed circuit probe tip that comprises a first contact section for contacting a device under test; and
   a second printed circuit probe tip that comprises a second contact section for contacting a device under test;
   wherein the first printed circuit probe tip and the second printed circuit probe tip are arranged between the first support plate and the second support plate and are mechanically supported by the first support plate and the second support plate,
   wherein the first printed circuit probe tip, and the second printed circuit probe tip each comprise a multi-layer printed circuit board with a planar inner conductor layer and a planar outer conductor layer on one side of the inner conductor layer, and another planar outer conductor layer on the other side of the inner conductor layer.

16. A differential measurement probe comprising:
   a first support plate;
   a second support plate arranged in parallel to the first support plate;
   a first printed circuit probe tip that comprises a first contact section for contacting a device under test; and
   a second printed circuit probe tip that comprises a second contact section for contacting a device under test;
   wherein the first printed circuit probe tip and the second printed circuit probe tip are arranged between the first support plate and the second support plate and are mechanically supported by the first support plate and the second support plate,
   wherein the edges of the first printed circuit probe tip and the second printed circuit probe tip are covered with a conductive material to electrically couple the two conductive shielding layers on the upside and the downside of the first printed circuit probe tip or the second printed circuit probe tip, respectively.

* * * * *